(12) United States Patent
    Masini et al.

(10) Patent No.: US 10,560,197 B2
(45) Date of Patent: *Feb. 11, 2020

(54) METHOD AND SYSTEM FOR OPTOELECTRONIC RECEIVERS UTILIZING WAVEGUIDE HETEROJUNCTION PHOTOTRANSISTORS INTEGRATED IN A CMOS SOI WAFER

(71) Applicant: Luxtera, Inc., Carlsbad, CA (US)

(72) Inventors: Gianlorenzo Masini, Carlsbad, CA (US); Subal Sahni, La Jolla, CA (US)

(73) Assignee: Luxtera, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/268,774

(22) Filed: Feb. 6, 2019

(65) Prior Publication Data

US 2019/0181959 A1    Jun. 13, 2019

Related U.S. Application Data

(63) Continuation of application No. 15/231,332, filed on Aug. 8, 2016, now Pat. No. 10,205,533, which is a
(Continued)

(51) Int. Cl.
    *H04B 10/60*    (2013.01)
    *G01J 1/44*     (2006.01)
    (Continued)

(52) U.S. Cl.
    CPC ............... *H04B 10/60* (2013.01); *G01J 1/44* (2013.01); *H01L 31/028* (2013.01);
    (Continued)

(58) Field of Classification Search
    CPC .... H03F 3/08; H01L 31/1105; H01L 31/1127; H01L 31/1128; H01L 31/1192;
    (Continued)

(56) References Cited

U.S. PATENT DOCUMENTS 4,734,750 A * 3/1988 Okamura ............. G11C 13/047
                                              257/187
5,783,839 A * 7/1998 Morikawa ....... H01L 31/035254
                                              257/19
(Continued)

*Primary Examiner* — John R Lee
(74) *Attorney, Agent, or Firm* — McAndrews, Held & Malloy

(57) ABSTRACT

A method and system for optoelectronic receivers utilizing waveguide heterojunction phototransistors (HPTs) integrated in a wafer are disclosed and may include receiving optical signals via optical fibers operably coupled to a top surface of the chip. Electrical signals may be generated utilizing HPTs that detect the optical signals. The electrical signals may be amplified via voltage amplifiers, or transimpedance amplifiers, the outputs of which may be utilized to bias the HPTs by a feedback network. The optical signals may be coupled into opposite ends of the HPTs. A collector of the HPTs may comprise a silicon layer and a germanium layer, a base may comprise a silicon germanium alloy with germanium composition ranging from 70% to 100%, and an emitter including crystalline or poly Si or SiGe. The optical signals may be demodulated by communicating a mixer signal to a base terminal of the HPTs.

20 Claims, 7 Drawing Sheets

Related U.S. Application Data continuation of application No. 14/091,259, filed on Nov. 26, 2013, now Pat. No. 9,425,342, which is a continuation of application No. 12/859,016, filed on Aug. 18, 2010, now Pat. No. 8,592,745.

(60) Provisional application No. 61/274,580, filed on Aug. 19, 2009, provisional application No. 61/274,588, filed on Aug. 19, 2009, provisional application No. 61/274,605, filed on Aug. 19, 2009.

(51) Int. Cl.
*H01L 31/0224* (2006.01)
*H01L 31/028* (2006.01)
*H01L 31/0368* (2006.01)
*H01L 31/11* (2006.01)
*H03F 3/08* (2006.01)

(52) U.S. Cl.
CPC ........... *H01L 31/022408* (2013.01); *H01L 31/03682* (2013.01); *H01L 31/1105* (2013.01); *H03F 3/08* (2013.01); *G01J 2001/446* (2013.01)

(58) Field of Classification Search
CPC . H01L 31/11; H01L 31/09; H01L 31/022408; H01L 31/028; H01L 31/03682; H01L 31/03685; H04B 10/60; H04B 10/66; H04B 10/691; G01J 1/44; G01J 2001/4473; G01J 2001/446
See application file for complete search history.

(56) References Cited

U.S. PATENT DOCUMENTS

| | | | | |
|---|---|---|---|---|
| 6,222,951 B1* | 4/2001 | Huang | ............... | H04B 10/2587 385/14 |
| 6,335,255 B1* | 1/2002 | Evaldsson | ........... | H01L 21/8252 257/E21.697 |
| 6,391,214 B1* | 5/2002 | Kovacic | ................... | G02B 6/42 216/24 |
| 6,703,647 B1* | 3/2004 | Garcia | ................ | H01L 31/1105 257/108 |
| 6,794,682 B2* | 9/2004 | Watanabe | ......... | H01L 27/14679 257/258 |
| 6,949,482 B2* | 9/2005 | Murthy | ............. | H01L 21/28518 438/739 |
| 7,082,247 B1* | 7/2006 | Gunn, III | ........... | G02B 6/12004 385/129 |
| 7,116,853 B2* | 10/2006 | Gunn, III | ................. | G02F 1/025 385/14 |
| 7,136,544 B1* | 11/2006 | Gunn, III | ........... | G02B 6/12004 385/3 |
| 7,251,408 B1* | 7/2007 | Gunn, III | ................. | G02F 1/025 385/132 |
| 7,265,006 B2* | 9/2007 | Augusto | ........... | H01L 27/14632 257/E27.133 |
| 7,453,132 B1* | 11/2008 | Gunn, III | ........... | H01L 31/0232 257/448 |
| 7,471,855 B2* | 12/2008 | Chen | ........................ | G02B 6/30 385/14 |
| 7,557,010 B2* | 7/2009 | Chen | ................... | H01L 21/8249 257/E21.131 |
| 7,616,904 B1* | 11/2009 | Gunn, III | ............. | H01L 31/109 257/431 |
| 7,723,754 B2* | 5/2010 | Wada | .................... | H01L 31/028 257/198 |
| 7,773,836 B2* | 8/2010 | De Dobbelaere | .... | G02B 6/4214 385/14 |
| 7,923,340 B2* | 4/2011 | Chen | ................... | H01L 21/8249 257/E21.131 |
| 8,049,282 B2* | 11/2011 | Dyson | ................... | H01L 21/743 257/370 |
| 8,062,919 B2* | 11/2011 | Apsel | ..................... | H01L 27/14 257/257 |
| 8,224,134 B2* | 7/2012 | Baeyens | ................. | G02B 6/12 385/14 |
| 8,298,901 B1* | 10/2012 | Foote | ................... | H01L 29/7378 257/E21.371 |
| 8,372,723 B2* | 2/2013 | Dyson | ................... | H01L 21/743 438/309 |
| 8,592,745 B2* | 11/2013 | Masini | ..................... | H03F 3/08 250/227.11 |
| 8,980,667 B2* | 3/2015 | Cai | ........................ | H01L 31/115 257/462 |
| 9,425,342 B2* | 8/2016 | Masini | ..................... | H03F 3/08 |
| 10,205,533 B2* | 2/2019 | Masini | ..................... | H03F 3/08 |
| 2001/0017399 A1* | 8/2001 | Oda | ................... | H01L 29/66242 257/565 |
| 2003/0015720 A1* | 1/2003 | Lian | ........................ | G02B 6/43 257/98 |
| 2003/0027409 A1* | 2/2003 | Ramdani | .................. | C30B 25/18 438/481 |
| 2003/0087466 A1* | 5/2003 | Wang | .................. | H01L 31/1105 438/45 |
| 2003/0116762 A1* | 6/2003 | Hwang | ................. | B82Y 20/00 257/20 |
| 2003/0146477 A1* | 8/2003 | Krutsick | ........... | H01L 21/82285 257/370 |
| 2003/0161571 A1* | 8/2003 | Davids | ................. | G02B 6/4214 385/14 |
| 2003/0186562 A1* | 10/2003 | Fujimaki | .......... | H01L 29/66242 438/791 |
| 2004/0036146 A1* | 2/2004 | Wang | .................. | H01L 31/1105 257/565 |
| 2004/0081467 A1* | 4/2004 | Taylor | ................... | H01L 29/155 398/161 |
| 2005/0130454 A1* | 6/2005 | Murthy | ............. | H01L 21/28518 438/296 |
| 2005/0238360 A1* | 10/2005 | Taylor | ................. | H01S 5/06203 398/138 |
| 2005/0253200 A1* | 11/2005 | Murthy | ............. | H01L 21/28518 257/382 |
| 2006/0008223 A1* | 1/2006 | Gunn, III | ................ | G02F 1/025 385/129 |
| 2006/0014334 A1* | 1/2006 | J.R.P. Augusto | ... | H01L 21/8249 438/154 |
| 2006/0022226 A1* | 2/2006 | Wada | ..................... | H01L 31/028 257/233 |
| 2006/0067708 A1* | 3/2006 | Keil | ..................... | G02F 1/0121 398/183 |
| 2007/0014508 A1* | 1/2007 | Chen | ........................ | G02B 6/30 385/14 |
| 2007/0148890 A1* | 6/2007 | Enicks | ............. | H01L 21/02381 438/312 |
| 2007/0262295 A1* | 11/2007 | Enicks | .................. | H01L 29/167 257/19 |
| 2008/0023767 A1* | 1/2008 | Voldman | ............. | H01L 27/0255 257/355 |
| 2008/0044968 A1* | 2/2008 | Murthy | ............. | H01L 21/28518 438/229 |
| 2008/0054391 A1* | 3/2008 | Apsel | ..................... | H01L 27/14 257/462 |
| 2008/0076228 A1* | 3/2008 | Dyson | ................... | H01L 21/743 438/309 |
| 2008/0191246 A1* | 8/2008 | Chen | ................... | H01L 21/8249 257/197 |
| 2008/0203425 A1* | 8/2008 | Sulima | ............. | H01L 31/03046 257/185 |
| 2008/0230862 A1* | 9/2008 | Singh | ................... | H01L 27/1446 257/436 |
| 2009/0022500 A1* | 1/2009 | Pinguet | ............ | G02B 6/1228 398/164 |
| 2009/0026967 A1* | 1/2009 | Mazumder | .......... | H01L 27/1446 315/159 |
| 2009/0186441 A1* | 7/2009 | Mouli | ................... | H01L 27/1463 438/73 |

(56) References Cited

U.S. PATENT DOCUMENTS

| | | | | |
|---|---|---|---|---|
| 2010/0065920 A1* | 3/2010 | Chen | ................... | H01L 21/8249 |
| | | | | 257/378 |
| 2011/0042553 A1* | 2/2011 | Masini | ...................... | H03F 3/08 |
| | | | | 250/214 A |
| 2011/0063024 A1* | 3/2011 | Kucharski | .............. | H03H 11/48 |
| | | | | 327/581 |
| 2014/0084144 A1* | 3/2014 | Masini | ...................... | H03F 3/08 |
| | | | | 250/214 A |
| 2016/0352431 A1* | 12/2016 | Masini | ...................... | H03F 3/08 |

* cited by examiner

METHOD AND SYSTEM FOR OPTOELECTRONIC RECEIVERS UTILIZING WAVEGUIDE HETEROJUNCTION PHOTOTRANSISTORS INTEGRATED IN A CMOS SOI WAFER

CROSS-REFERENCE TO RELATED APPLICATIONS/INCORPORATION BY REFERENCE

This application is a continuation of application Ser. No. 15/231,332 filed on Aug. 8, 2016, which is a continuation of application Ser. No. 14/091,259 filed on Nov. 26, 2013, now U.S. Pat. No. 9,425,342, which is a continuation of application Ser. No. 12/859,016 filed on Aug. 18, 2010, now U.S. Pat. No. 8,592,745, which in turn makes reference to and claims priority to U.S. Provisional Application Ser. No. 61/274,580 filed on Aug. 19, 2009, U.S. Provisional Application Ser. No. 61/274,588 filed on Aug. 19, 2009, and U.S. Provisional Application Ser. No. 61/274,605 filed on Aug. 19, 2009, which are all hereby incorporated herein by reference in their entirety

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to signal processing. More specifically, certain embodiments of the invention relate to a method and system for optoelectronic receivers utilizing waveguide heterojunction phototransistors integrated in a CMOS SOI wafer.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Optical communication systems have been widely adopted for applications ranging from internet backbone, local area networks, data centers, supercomputing, to high-definition video. Due to superior bandwidth and low loss, optical fibers are the medium of choice for transporting high-speed binary data. However, virtually all data processing is still performed in the electrical domain. This necessitates an electrical-to-optical conversion (EO) in transmitters and optical-to-electrical (OE) conversion in receivers. Robust EO conversion is simpler, since electrical signals in the transmitter can be relatively large and well-controlled to match characteristics of lasers or optical modulators. On the other hand, OE recovery is complicated by numerous optical loss mechanisms present in practical links as well as penalties incurred due to transmitter non-idealities such as finite extinction ratio (ER).

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for optoelectronic receivers utilizing waveguide heterojunction phototransistors integrated in a CMOS SOI wafer, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for optoelectronic receivers utilizing waveguide heterojunction phototransistors integrated in a CMOS SOI wafer. Exemplary aspects of the invention may comprise receiving one or more optical signals via optical fibers coupled to a top surface of the photonically-enabled CMOS chip. One or more electrical signals may be generated utilizing one or more germanium waveguide heterojunction phototransistors that detect the one or more optical signals received via one or more grating couplers. The electrical signals may be amplified via one or more voltage amplifiers, or one or more transimpedance amplifiers, the outputs of which may be utilized to bias the one or more germanium waveguide heterojunction phototransistors by a feedback network. The one or more received optical signals may be coupled into opposite ends of the one or more waveguide heterojunction phototransistors. A collector region of the one or more germanium waveguide heterojunction phototransistors may comprise a silicon layer and a germanium layer, and a base region of the one or more germanium waveguide heterojunction phototransistors may comprise a silicon germanium alloy with germanium composition ranging from 70% to 100%, for example. The germanium waveguide heterojunction phototransistors may be biased via an electrical signal applied to a base terminal or via an optical signal. The received one or more optical signals may be demodulated by communicating a mixer signal to a base terminal of the one or more germanium waveguide heterojunction phototransistors.

Figure 1A:
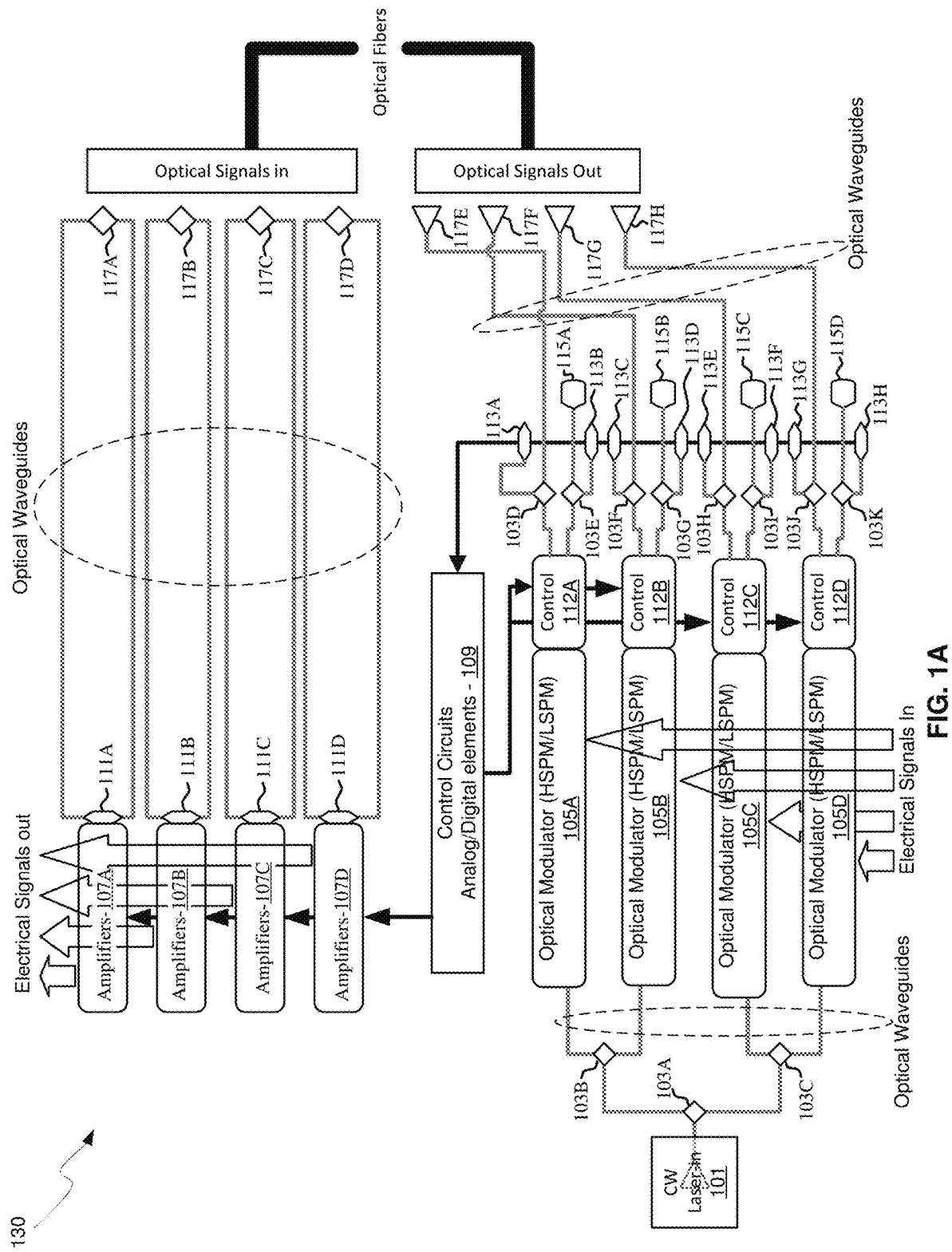
FIG. 1A is a block diagram of a photonically enabled CMOS chip comprising germanium heterojunction phototransistors, in accordance with an embodiment of the invention.

FIG. 1A is a block diagram of a photonically enabled CMOS chip comprising germanium heterojunction phototransistors, in accordance with an embodiment of the invention. Referring to FIG. 1A, there is shown optoelectronic devices on a CMOS chip 130 comprising optical modulators 105A-105D, high-speed heterojunction phototransistors 111A-111D, monitor photodiodes 113A-113H, and optical devices comprising taps 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example. Optical signals are communicated between optical and optoelectronic devices via optical waveguides fabricated in the CMOS chip 130.

The optical modulators 105A-105D comprise Mach-Zehnder or ring modulators, for example, and enable the modulation of the CW laser input signal. The optical modulators 105A-105D comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

This mismatch between the waveguides may be intentional, such as in an imbalanced MZI, but is often unintentional in a nominally balanced MZI due to small imperfections in waveguide fabrication. The phase modulators then have a dual role: to compensate for the passive biasing of the MZI and to apply the additional phase modulation used to modulate the light intensity at the output port of the MZI according to a data stream. The former phase tuning and the latter phase modulation may be applied by separate, specialized devices, since the former is a low speed, slowly varying contribution, while the latter is typically a high speed signal. These devices are then respectively referred to as the LSPM and the HSPM. Examples for LSPM are thermal phase modulators (TPM), where a waveguide portion is locally heated up to modify the index of refraction of its constituting materials, or forward biased PIN junctions (PINPM) where current injection into the PIN junction modifies the carrier density, and thus the index of refraction of the semiconductor material. An example of an HSPM is a reversed biased PIN junction, where the index of refraction is also modulated via the carrier density, but which allows much faster operation, albeit at a lower phase modulation efficiency per waveguide length.

The outputs of the modulators may be optically coupled via waveguides to the grating couplers 117E-117H. The taps 103D-103K comprise four-port optical couplers, for example, and are utilized to sample the optical signals generated by the optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the CMOS chip 130. The grating couplers 117A-117D are utilized to couple light received from optical fibers into the CMOS chip 130, and the grating couplers 117E-117H are utilized to couple light from the CMOS chip 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the CMOS chip 130 to optimize coupling efficiency. In an embodiment of the invention, the optical fibers may comprise single-mode fiber (SMF) and/or polarization-maintaining fiber (PMF). By integrating CMOS chips at each end of the optical fibers, a bidirectional link is enabled that may only require a single laser. In another embodiment of the invention, a single laser and a single fiber may be utilized to configure a bidirectional link. This may be enabled by using a PSGC, where two optical signals may be launched into the same fiber, for example.

In another exemplary embodiment, optical signals may be communicated directly into the surface of the CMOS chip 130 without optical fibers by directing a light source on an optical coupling device in the chip, such as the light source interface 135 and/or the optical fiber interface 139. This may be accomplished with directed laser sources and/or optical sources on another chip flip-chip bonded to the CMOS chip 130.

The high-speed heterojunction phototransistors 111A-111D may convert optical signals received from the grating couplers 117A-117D into electrical signals that are communicated to the amplifiers 107A-107D for processing. The high-speed heterojunction phototransistors 111A-111D may comprise germanium (Ge) in the collector and base regions for absorption in the 1.55 µm optical wavelength range, and may be integrated on a CMOS silicon-on-insulator (SOI) wafer.

High-speed, low noise photodetectors are key components in modern optical communications. Among the three main classes of semiconductor photodetectors, namely photodiodes, avalanche photodiodes (APDs), and phototransistors, the latter demonstrating higher intrinsic gain at bias voltages that are much lower than those used for APDs and with much lower noise.

HPT speed and gain performance may be improved by replacing the base-emitter junction with an appropriate gradual heterojunction. Phototransistor spectral response may be extended to the third window of fiber-optic communication at 1.55 µm by replacing SiGe in the transistor base with pure Ge, thereby dramatically increasing the efficiency at around 1.55 µm due to the much higher absorption coefficient of Ge at that wavelength. Moreover, the larger valence band discontinuity may further increase the emitter efficiency, thus resulting in even higher gain. A thicker Ge base layer may be utilized to distance the active absorbing region of the HPT from the misfit dislocations caused by the large lattice mismatch (~4%) existing between the two semiconductors.

In an exemplary embodiment of the invention, heterojunction phototransistors (HPTs) may comprise pure Ge not only in the base, but also part of the collector, thus allowing high absorption efficiency close to 1.55 µm and a sufficient spacing of the sensitive base layer from the defects at the Si/Ge heterointerface. Moreover, the device comprises a waveguide optical configuration in which the light may be coupled and absorbed perpendicular to the current flow direction, thus allowing for independent optimization of efficiency and transit time. The small overall thickness of the device, its geometry and the type of processes used for its fabrication allow its integration alongside other optical and electrical components in a CMOS SOI wafer.

The analog and digital control circuits 109 may control gain levels or other parameters in the operation of the amplifiers 107A-107D, which then communicate electrical signals off the CMOS chip 130. The control sections 112A-112D comprise electronic circuitry that enable modulation of the CW laser signal received from the splitters 103A-103C. The optical modulators 105A-105D require high-speed electrical signals to modulate the refractive index in respective branches of a Mach-Zehnder interferometer (MZI), for example. In an embodiment of the invention, the control sections 112A-112D may include sink and/or source driver electronics that may enable a bidirectional link utilizing a single laser.

In operation, the CMOS chip 130 may be operable to transmit and/or receive and process optical signals. The grating couplers 117A-117D may be operable to receive optical signals from optical fibers coupled to the chip 130 and may convert the optical mode of the fiber into the much smaller mode of a Si waveguide fabricated on the CMOS SOI wafer. The grating couplers 117A-117D may comprise a single-polarization or a polarization-splitting type: in the first case, only a specific polarization is coupled to a single Si waveguide, while in the second case, two orthogonal polarizations are split into two output waveguides. The opto-electronic converter is realized, in this application, using an integrated waveguide Si/Ge heterojunction phototransistor (HPT). The high-speed heterojunction phototransistors 111A-111D comprise npn type devices and may have two equivalent optical inputs and two, or optionally three, electrical terminals including the emitter and the collector, with the optional third base terminal, which may be used for biasing and signal mixing. Depending on the type of grating coupler used, one end or both inputs of the HPT waveguide may receive the optical signal coming from the grating coupler output(s). In a typical biasing scheme, the collector may be biased at a higher voltage than the emitter. The base electrode, if present, may be biased at an intermediate voltage between collector and emitter.

In an exemplary embodiment of the invention, the HPT of the high-speed heterojunction phototransistors 111A-111D realizing the current-to-voltage conversion may be DC connected to one of the inputs of a trans-impedance amplifier (TIA), while another identical HPT, not illuminated, may be connected to the other input of the TIA to create a balanced architecture. In this scheme, the bias for the HPTs may be derived from the TIA outputs through feedback impedances. In an alternative to this embodiment, when a signal and its complementary are impressed on two orthogonal polarizations of the optical carrier and are split into two waveguides by a splitting grating coupler, the two HPTs may receive these two signals, thus realizing a fully symmetrical receiver.

In another exemplary embodiment of the invention, a single HPT may be biased from a voltage supply through one or more impedances connecting the collector to the positive supply and the emitter to ground. In this case, the photocurrent to voltage conversion may be realized through the impedances and the TIA may be replaced by a low noise voltage amplifier. Connection of the collector and emitter to the inputs of the voltage amplifier may be realized through high pass filters to decouple the HPT bias from the amplifier bias. The biasing impedances may comprise inductors to introduce peaking and improve the high frequency response.

Figure 1B:
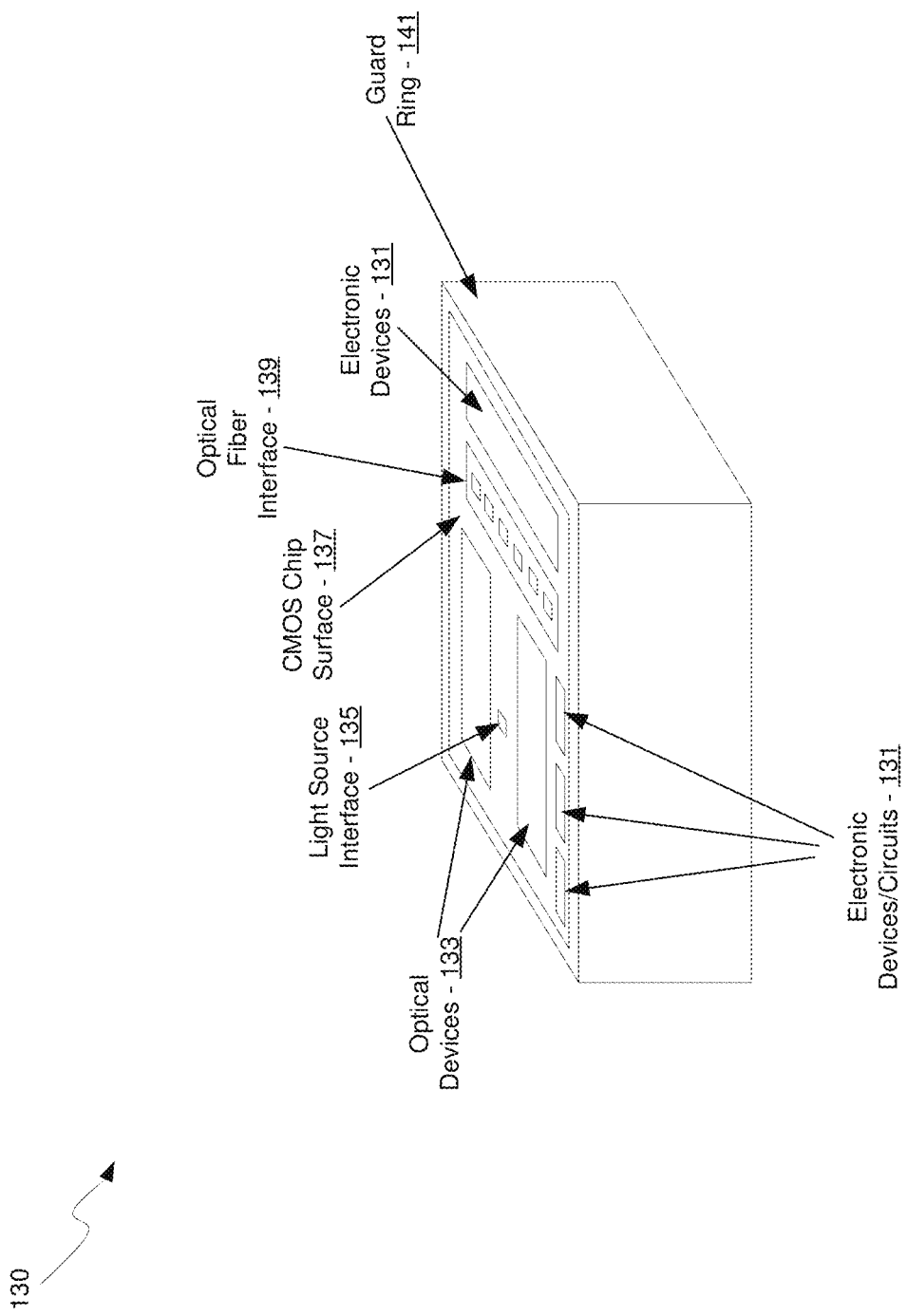
FIG. 1B is a diagram illustrating an exemplary CMOS chip, in accordance with an embodiment of the invention.

FIG. 1B is a diagram illustrating an exemplary CMOS chip, in accordance with an embodiment of the invention. Referring to FIG. 1B, there is shown the CMOS chip 130 comprising electronic devices/circuits 131, optical and optoelectronic devices 133, a light source interface 135, CMOS chip front surface 137, an optical fiber interface 139, and CMOS guard ring 141.

The light source interface 135 and the optical fiber interface 139 comprise grating couplers, for example, that enable coupling of light signals via the CMOS chip surface 137, as opposed to the edges of the chip as with conventional edge-emitting devices. Coupling light signals via the CMOS chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the taps 103A-103K, optical terminations 115A-115D, grating couplers 117A-117H, optical modulators 105A-105D, high-speed heterojunction phototransistors 111A-111D, and monitor photodiodes 113A-113H.

In an embodiment of the invention, the high-speed heterojunction phototransistors 111A-111D may be integrated in a SOI CMOS substrate and may comprise germanium in the base and collector regions, enabling the detection of 1.55 µm optical signals. The Ge processing steps may be inserted between standard CMOS processing steps, and the Ge layer deposited on Si may be thick enough to separate the base-collector depletion region from dislocations at the Ge—Si interface.

Figure 1C:
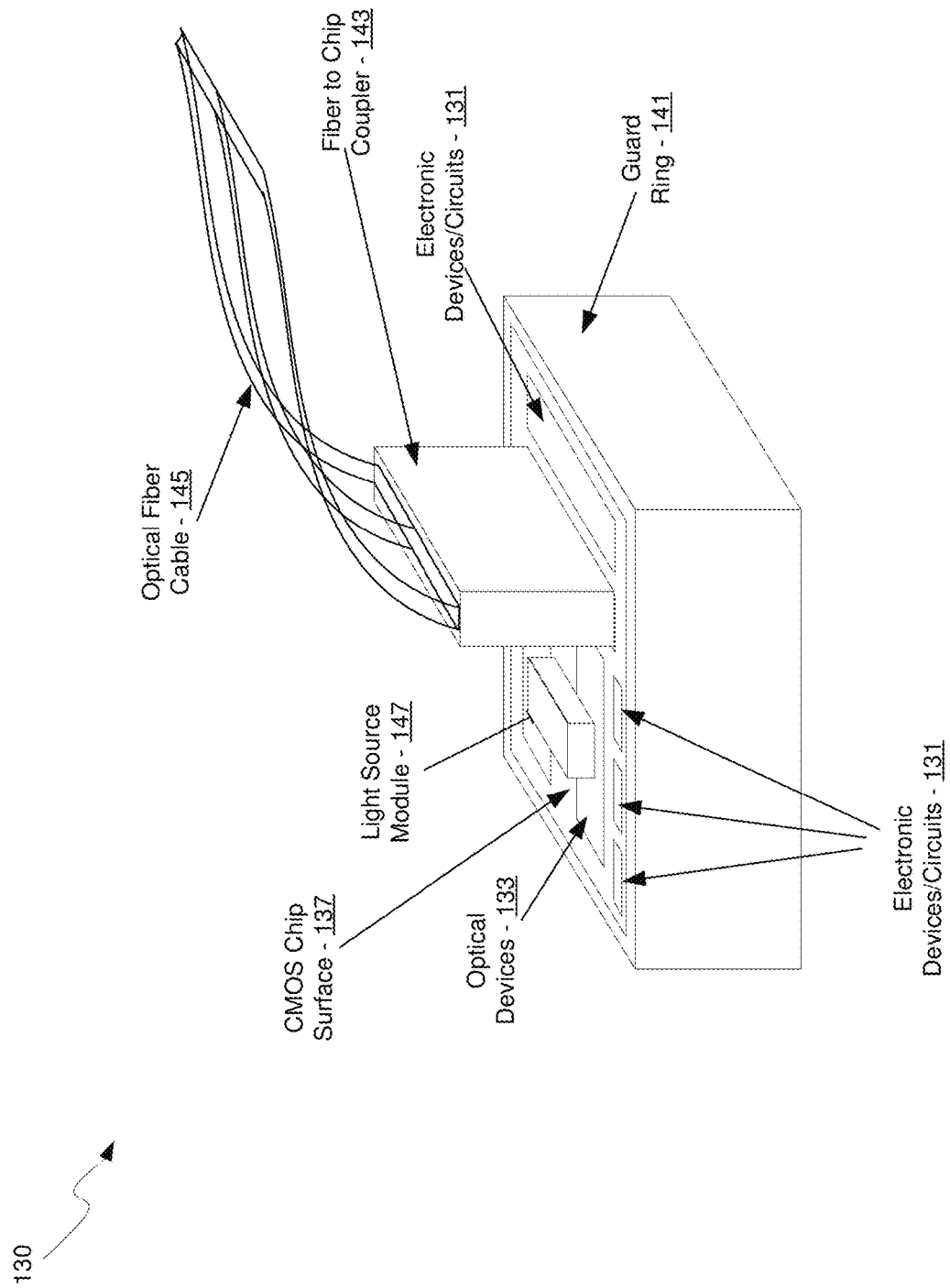
FIG. 1C is a diagram illustrating an exemplary CMOS chip coupled to an optical fiber cable, in accordance with an embodiment of the invention.

FIG. 1C is a diagram illustrating an exemplary CMOS chip coupled to an optical fiber cable, in accordance with an embodiment of the invention. Referring to FIG. 1C, there is shown the CMOS chip 130 comprising the CMOS chip surface 137, and the CMOS guard ring 141. There is also shown a fiber-to-chip coupler 143, an optical fiber cable 145, and an optical source assembly 147.

The CMOS chip 130 comprising the electronic devices/circuits 131, the optical and optoelectronic devices 133, the light source interface 135, the CMOS chip surface 137, and the CMOS guard ring 141 may be as described with respect to FIG. 1B.

In an embodiment of the invention, the optical fiber cable may be affixed, via epoxy for example, to the CMOS chip surface 137. The fiber chip coupler 143 enables the physical coupling of the optical fiber cable 145 to the CMOS chip 130.

Figure 2:
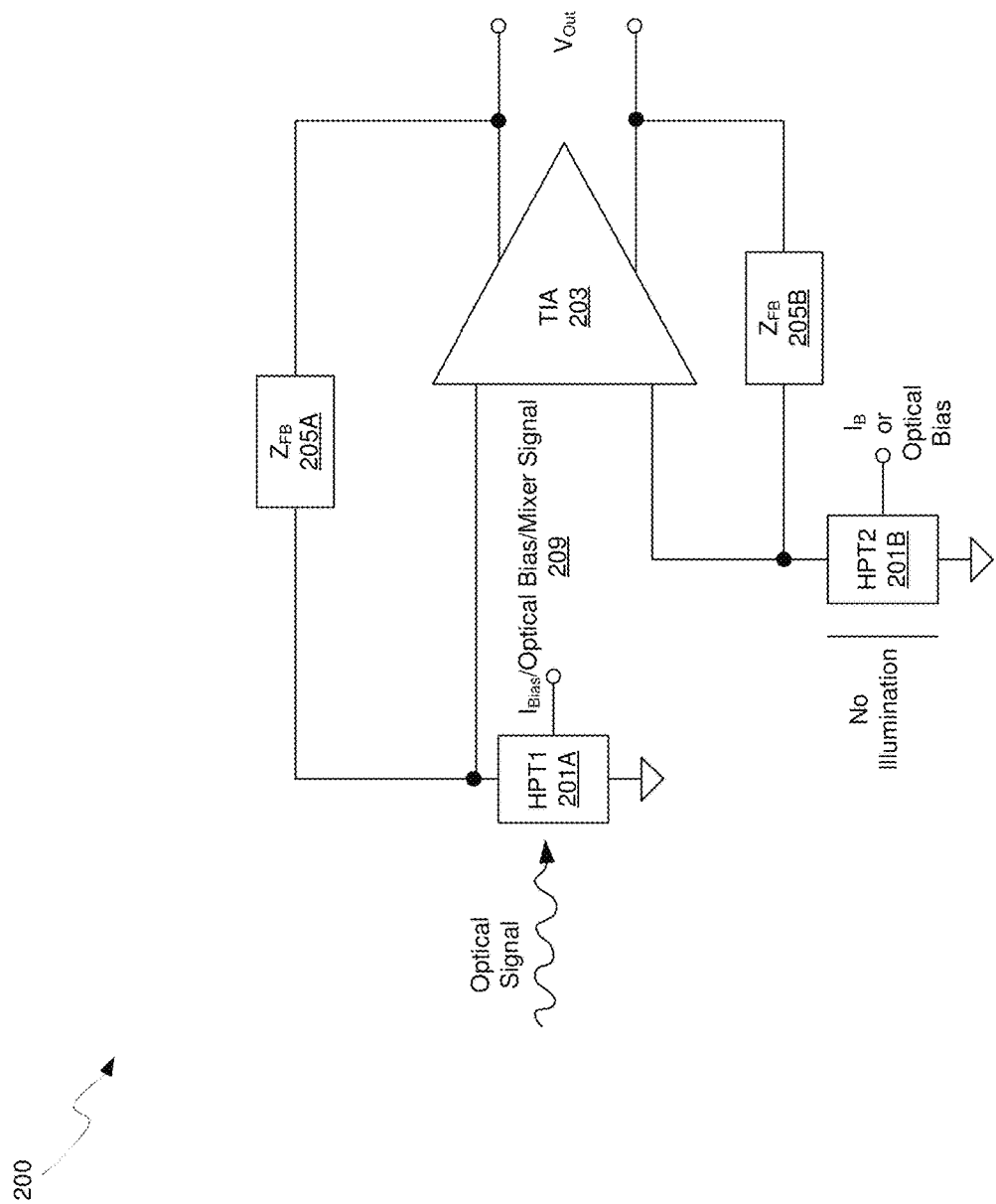
FIG. 2 is a block diagram of an optical receiver comprising heterojunction phototransistors, in accordance with an embodiment of the invention.

FIG. 2 is a block diagram of an optical receiver comprising heterojunction phototransistors, in accordance with an embodiment of the invention. Referring to FIG. 2, there is shown a receiver 200 comprising HPTs 201A and 201B, TIA 203, and feedback impedances 205A and 205B. There is also shown an input optical signal and a receiver output signal.

The HPTs 201A and 201B comprise npn heterojunction phototransistors, for example, and may be fabricated with Ge collector and base regions on a SOI CMOS substrate. In this manner, high-speed operation may be enabled with detection out to the 1.55 µm optical wavelength range. The HPTs 201A and 201B may comprise two equivalent optical inputs and two, or optionally three, electrical terminals including the emitter and the collector, with the optional third base terminal, which may be used for biasing and signal mixing. In a typical biasing scheme, the collector may be biased at a higher voltage than the emitter. The base electrode, if present, may be biased at an intermediate voltage between collector and emitter.

The TIA 203 may comprise a current-to-voltage amplifier that may be operable to amplify input currents and generate output voltages. The TIA 203 may comprise feedback impedances 205A and 205B, which may comprise resistors, or a combination or resistors, capacitors, and inductors for frequency response compensation.

In operation, the HPT 201A realizing the current-to-voltage conversion of the received optical signal may be DC-coupled to one of the inputs of the TIA 201, while HPT 201B, not illuminated, is connected to the other input to create a balanced architecture. In this manner, the bias to the HPTs 201A and 201B may be derived from the TIA 203 outputs through feedback impedances 205A and 205B. The receiver 200 may generate an output signal, $V_{Out}$, that may comprise a voltage signal proportional to the received optical signal.

In an embodiment of the invention, the base terminal of the HPTs 201A and 201B, if existing, may be biased using a second voltage source, possibly through a resistor or a passive compensation network of inductors, capacitors, resistors, for example, which may be used to equalize the frequency response of the HPTs 201A and 201B. HPT bias may also occur optically through the non-ideal extinction ratio of the incoming signal or by an additional optical biasing signal injected in the device. The base terminal may also be used to implement an AGC function where the current injected may be determined based on the averaged signal amplitude at the output of the amplifier.

Figure 3:
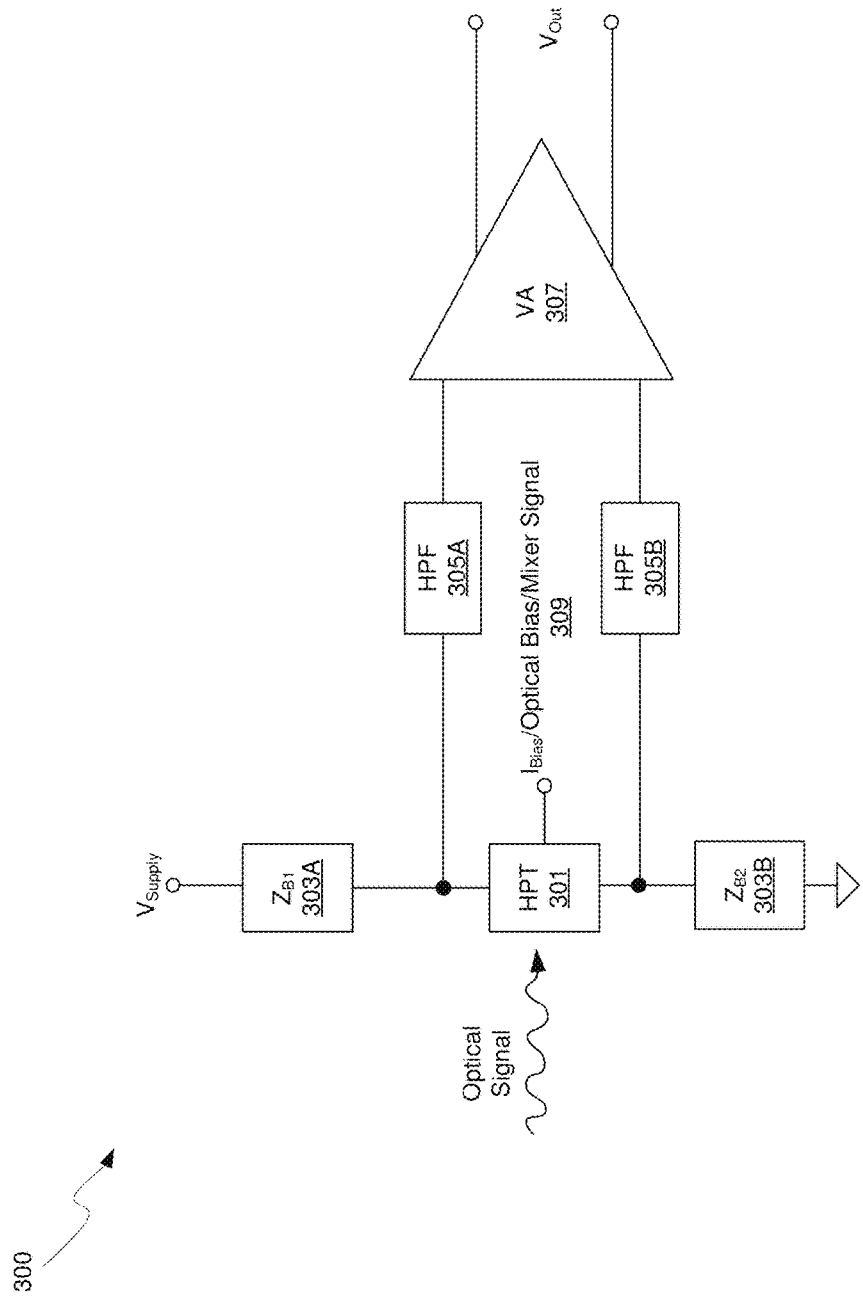
FIG. 3 is a block diagram of an optical receiver comprising a single heterojunction phototransistor, in accordance with an embodiment of the invention.

FIG. 3 is a block diagram of an optical receiver comprising a single heterojunction phototransistor, in accordance with an embodiment of the invention. Referring to FIG. 3, there is shown a receiver 300 comprising an HPT 301, bias impedances 303A and 303B, high-pass filters (HPFs) 305A and 305B, and a voltage amplifier 307. There is also shown an input optical signal, a supply voltage, $V_{Supply}$, and an output signal, $V_{Out}$.

The HPT 301 may be substantially similar to the HPTs 201A and 201B described with respect to FIG. 2, but coupled to a voltage amplifier via the HPFs 305 and 305B to decouple the HPT bias from that of the voltage amplifier 307. The HPFs 305A and 305B may comprise resistor, capacitor, and/or inductor networks, for example, that may be operable to block low-frequency signals, while allowing high-frequency signal to pass through to the voltage amplifier 307.

In operation, the HPT 301 may be biased from the voltage supply, $V_{Supply}$, through the bias impedances $Z_{B1}$ and $Z_{B2}$ 303A and 303B, connecting the collector to the positive supply and the emitter to ground. The biasing impedances $Z_{B1}$ and $Z_{B2}$ 303A and 303B may comprise resistors and inductors to introduce peaking and improve the high frequency response. In this case, the photocurrent to voltage conversion may be realized through the impedances $Z_{B1}$ and $Z_{B2}$ and the voltage amplifier then amplifies the voltage generated by the HPT 301 from the received optical signal, thereby generating an output signal, $V_{Out}$, proportional to the received optical signal.

In an embodiment of the invention, the base terminal of the HPT 301, if existing, may be biased using a second voltage source 309, possibly through a resistor or a passive compensation network of inductors, capacitors, resistors, for example, which may be used to equalize the frequency response of the HPT 301. HPT bias may also occur optically through the non-ideal extinction ratio of the incoming signal or by an additional optical biasing signal injected in the device. The base terminal may also be used to implement an AGC function where the current injected may be determined based on the averaged signal amplitude at the output of the amplifier.

In addition to biasing the HPT 301, the optional base terminal may be utilized to mix the received optical signal with a local optical signal 309. In this manner, analog signals carried by an optical carrier may be demodulated or shifted in frequency utilizing a local electrical oscillator.

In another exemplary embodiment of the invention, a DC floating base terminal may also be used to detect the presence and amplitude of the optical signal impinging on the HPT 301 to realize a loss of signal (LOS) detector, where a DC voltage present between the base and the emitter is dependent logarithmically on the base current flowing in the device. The base current may comprise a thermal and an optical component, the latter being induced by the absorbed light.

Figure 4:
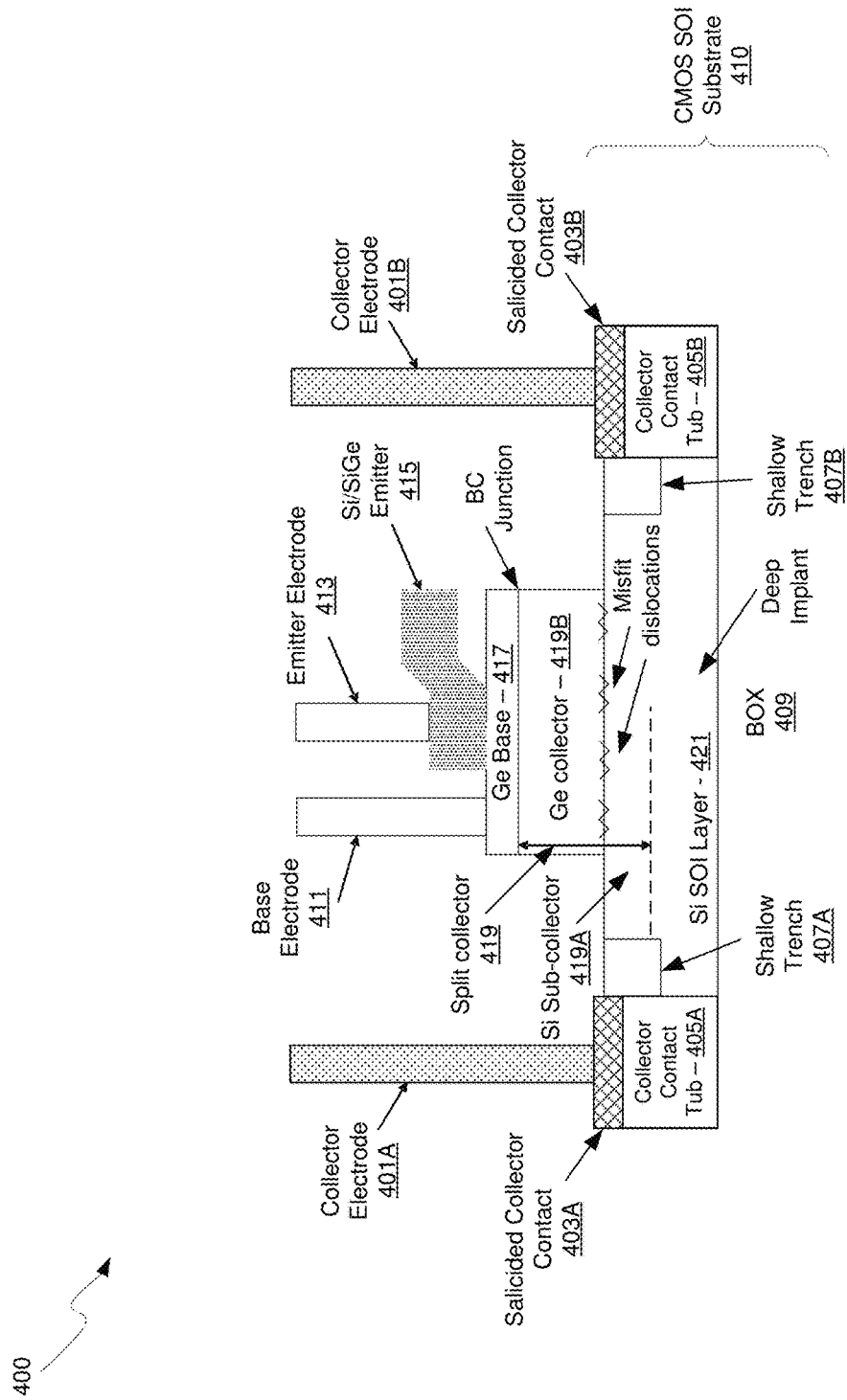
FIG. 4 is a cross-sectional view of a phototransistor integrated in a silicon-on-insulator substrate, in accordance with an embodiment of the invention.

FIG. 4 is a cross-sectional view of a phototransistor integrated in a silicon-on-insulator substrate, in accordance with an embodiment of the invention. Referring to FIG. 4, there is shown an HPT 400 comprising a split collector 419, a Ge base 417, and an emitter 415. There is also shown collector electrodes 401A and 401B, salicided collector contacts 403A and 403B, collector contact tubs 405A and 405B, shallow trenches 407A and 407B, a buried oxide 409, a base electrode 411, an emitter electrode 413, a Si sub-collector 419A, a Ge collector 419B, and a silicon SOI layer 421.

The HPT 400 comprises a Si sub-collector layer realized by implanting n-type impurities in the device layer of an SOI wafer, the Si SOI layer 421. The split collector 419 may comprise the Ge collector 419B and the Si sub collector 419A configured in the Si SOI layer 421. A thicker Ge collector layer 419B may be utilized to distance the base-collector junction from the Ge/Si interface where misfit dislocations are generated due to the ~4% lattice mismatch between Ge and Si.

Depending on the nature of the Ge/Si interface, the base-collector depletion layer may or may not be configured to extend into the Si. For sub-optimal interfaces, the collector may be formed entirely in the Ge layer in order to minimize the effect of interfacial defects on current transport across the base-collector junction. If very low interface defect density is achieved, then the profile of the n-doping in the Si can be gradually increased from the surface to the buried oxide such that part of the depletion region resides in the Si layer, for operating voltage versus transit time optimization. The peak concentration of n-type doping in this case may be on the order of $10^{19}$-$10^{20}$ cm$^{-3}$. The thickness of the Si sub collector 419A may vary from ~50 to ~600 nm, for example. The Si sub collector 419A may then be overgrown with an epitaxial pure Ge film whose first part (collector) is n-type doped to form the collector and the remaining thickness is p-doped to form the base. The collector portion of the Ge epilayer may be grown to a thickness of ~50 to ~200 nm and n-doped to a concentration of ~$10^{18}$ cm$^{-3}$ and base region may be grown to a thickness of ~20 to ~100 nm and p-doped with a concentration of ~$10^{19}$ cm$^{-3}$. The composition of the base region may be gradually changed from pure Ge to ~80% SiGe in order to create a quasi-electric field reducing carrier transit time in the base. Both the Ge film and the Si underneath may be laterally lithographically defined in order to allow confined propagation of one or more optical modes at a wavelength close to 1.5 μm in the direction perpendicular to the figure. The thickness of the Ge-collector 419B may be configured such that the defects at the Si/Ge interface do not interact with carriers diffusing in the base layer.

The HPT 400 may be completed by deposition of an n-type doped polycrystalline or crystalline Si or SiGe film to define the emitter 415. The polysilicon (or poly-SiGe) film is in contact with the Ge film through openings in a passivation dielectric film. The contact area may be configured based on a tradeoff between junction area and base resistance. In addition, the position of the contact region may be chosen to minimize or maximize the proximity to the lobes of an optical mode traveling in the waveguide, thus optimizing for efficiency by reducing absorption/scattering in the poly film, or speed by reducing the transit time of photogenerated carriers.

In another exemplary embodiment, the base electrode 411 may be configured on the Ge base 417 in order to electrically bias the HPT 400. The base electrode may be positioned longitudinally (i.e. in the direction of light propagation, perpendicular to the figure) following similar considerations as those reported above for the emitter layer.

The collector electrodes 401A and 401B may be configured to the side of the structure, outside the shallow trenches 407A and 407B used to help confine the optical modes, by contacting the top layer of the n-type doped Si, the salicided collector contacts 403A and 403B. The salicidation process may be utilized to reduce parasitic collector resistance.

In operation, the HPT 400 may be biased via the emitter, base, and collector contacts comprising the emitter electrode 413, the base electrode 411, and the collector electrodes 401A and 401B, respectively. Optical signals may be coupled to the ends of the HPT 400, i.e. into and out of the plane of FIG. 4, with the light absorbed by the Ge layers generating electron-hole pairs that may be swept out to the appropriate terminals by the electric field in the depletion regions. In this manner, an electrical current may be generated from collector to emitter that is proportional to the absorbed light signal.

Figure 5:
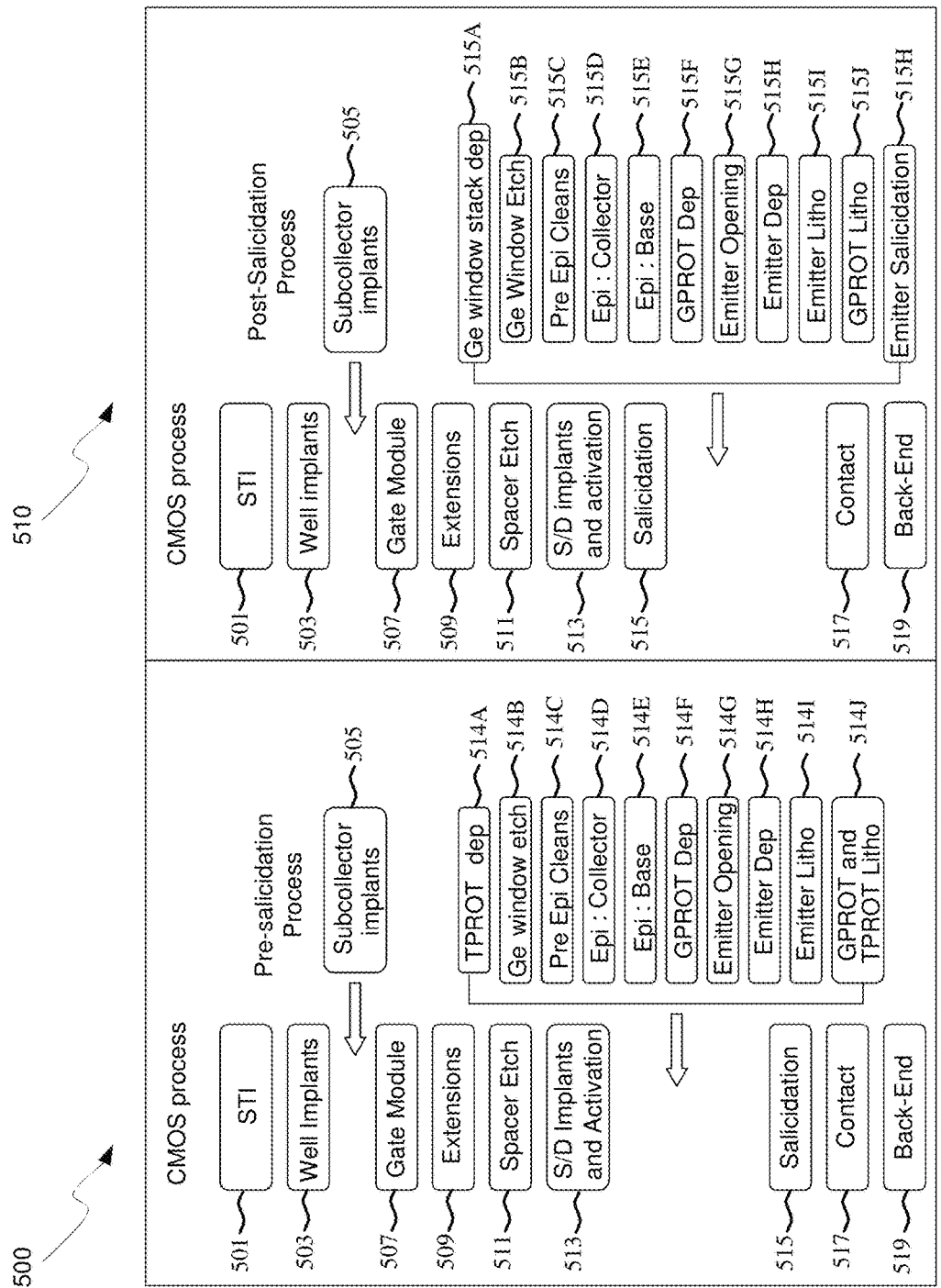
FIG. 5 is a block diagram of exemplary heterojunction phototransistor CMOS and pre-salicidation processes, in accordance with an embodiment of the invention.

FIG. 5 is a block diagram of exemplary heterojunction phototransistor CMOS and pre-salicidation processes, in accordance with an embodiment of the invention. Referring to FIG. 5, there is shown exemplary embodiments of CMOS and salicidation processes, with the left example 500 comprising a pre-salicidation process and the right example 510 comprising a post-salicidation process.

In the CMOS/salicidation process flows 500 and 510 shown in FIG. 5, the CMOS steps comprise: shallow trench isolation (STI) 501, deep implant/well formation 503, a gate module 507, extension implants 509, spacer etch 511, source/drain (S/D) implants and activation 513, salicidation 515, contact 517, and back-end 519, where back-end 519 comprises all metal/via formation and final passivation. The pre-salicidation process of process 500 comprises subcollector implants 505, temporary transistor protect (TPROT) deposition 514A, Ge window etch 514B, pre-epi cleans 514C, epi: collector 514D, Epi: base 514E, gate protect deposition 514F, emitter opening 514G, emitter deposition 514H, emitter lithography 514I, and gate protect and temporary protect litho 514J. The post-salicidation process 510 comprises a Ge window stack deposition 515A, Ge window etch 515B, pre-epi cleans 515C, epi: collector 515D, epi: base 515E, gate protect deposition 515F, emitter opening 515G, emitter deposition 515H, emitter lithography 515I, gate protect lithography 515J, and emitter salicidation 515H.

The subcollector implants 505 to form the Si part of the collector region of a HPT, such as the Si SOI layer shown in FIG. 4, may be performed together with the well implants 503 just after the STI module 501. In the epi steps, epi: collector 514D, epi: base 514E, epi: collector 515D, and epi: base 515E, pure Ge films cannot withstand temperatures higher than ~900 C. Moreover, interdiffusion with Si and the fast diffusion of n-type dopants may occur at a significantly lower temperature. Thus, the integration of the Ge epi steps 514D, 514E, 515D, and 515E after the S/D implants and activation 513 may be desirable because of the high temperatures used in that process, which may include a spike anneal at ~1000 C.

The Ge epi processes may be incorporated just before the salicidation 515 step, as shown in process 500, to avoid exposing the salicide films, such as NiSi, for example, from the thermal processes involved in the substrate cleaning process, pre-epi cleans 514C and 515C, preceding Ge epitaxy 514D, 514E, 515D, and 515E. At this time in the process, transistor polygates and S/D regions in active Si are exposed, and therefore in the first step, a temporary transistor protective layer (TPROT) 514A may be deposited to avoid Ge epitaxy occurring on the exposed transistor Si and poly. This may comprise a thin oxide layer (~50-100 nm) that may be later removed without harming the spacer nitride. If needed, a second dielectric layer of different composition (nitride/oxynitride) may be deposited on top of the oxide in order to create the right sidewall heights in the windows open for selective epitaxy in the next step. Finally, the dielectric stack may be terminated with an oxide layer to improve epi selectivity. Windows may then be opened in the dielectric stack to expose the Si active layer in places where the Ge film will be deposited. Etching can proceed partially in the Si in order to create a recess that helps optical coupling and electrical field distribution and also minimizes the topography on the wafer after the epitaxy.

Ge epi may be preceded by wet and in-situ cleaning steps. The wet processes may comprise HF, ozone-based and RCA-style processes, while the in-situ processes in the epi tool, may comprise hydrogen, HCl, or Germane flows, at a substrate temperature between ~350 C and ~800 C. These processes remove residual contaminants, such as O and C, from the Si surface and prepare the wafer for Ge epitaxy. The cleaning steps 514C may be iterated one or more times in order to improve surface quality.

The epitaxy steps 514D, 514E, 515D, and 515E may comprise a fully selective process using a mixture of GeH$_4$ and HCl or by a two step process in which a blanket film deposition may be followed by a poly phase selective etch, utilizing HCl, for example. The deposition/etch cycle may be repeated several times to improve film quality and selectivity. Also the collector part of the device may be grown using the growth and etch back method, while the base may use a fully selective process to improve thickness control. A carrier gas such as hydrogen or nitrogen may be used during the process to help establish an appropriate chamber pressure. The epi process occurs at a substrate temperature in the range ~350 C to ~450 C. The graded composition region of the epi film, the base, where the composition may be changed from 100% Ge to ~80% Ge, may be grown by incorporating SiH$_4$ or SiH$_2$Cl$_2$ to the gas mixture and increasing the substrate temperature to ~500 C.

Optional co-doping with carbon in the base film may be accomplished by adding $CH_4$ or a similar carbon source to the gas mixture.

Doping may be introduced in the epitaxial film by using $PH_3$ or $AsH_3$ or an alternative source of P or As species for the n-type collector and $B_2H_3$ or other sources of B atoms for p-type doping in the gas mixture. Desired doping concentration profiles may be obtained by regulating the flow of the different species during the growth. Optionally, a delta-doped base may be obtained by temporarily interrupting the flow of the Si and Ge precursors, thus generating a single sub-layer of doping atoms embedded in the epi material. Epitaxy may be completed with the deposition of a pure Si film of a few nm thickness to protect the SiGe/Ge film from oxidation. Doping activation by RTA may occur in the epi tool or later on in the process.

The epi steps 514D, 514E, 515D, and 515E may be followed by the blanket deposition of a protective layer, GPROT 514F, which may comprise an oxide, nitride, oxinitride, or a multilayer of these materials, and whose thickness and composition may be chosen to help in the formation of the optional contact base later on in the process, while minimizing the emitter/base overlap capacitance. The emitter may be processed in the emitter opening step 514G by opening windows in this protective layer corresponding to the desired placement of the subsequent epitaxial layer deposition. Reactive ion etching (RIE) may be used for this window process.

A wet and or in-situ cleaning step may follow the emitter window opening process 514G as part of the emitter deposition 514H. A blanket polysilicon or SiGe highly n-doped layer using P, As, or Sb, for example may then be deposited to a thickness of ~100-400 nm. The poly Si/SiGe may then lithographically defined to form the emitter electrodes and may be removed from everywhere else on the wafer. The gate protection (GPROT) layer may then be patterned outside of the regions where the epi film is deposited with some margin to ensure sealing of the epi film and the original transistor protective layer (TPROT) is finally removed by either dry or wet etch, GPROT and TPROT lithography 514J.

The process then proceeds back to the main stream of the CMOS process technology with surface cleaning prior to Ni (or Co) deposition and reaction to form the salicide in the salicidation step 515. Since the emitter polySi/SiGe is exposed at this time, it will be salicided as well, thus reducing its sheet resistance which is beneficial for transistor performance (speed). At a later time, when contacts are formed, in addition to the standard polygate and active electrodes, contacts to the collector (same as active), base (on top of the Ge/SiGe epi) and emitter (poly above the Ge/SiGe epi) will be formed.

A variant of this process may be shown in the CMOS/salicide process 510 which may be utilized when the thermal budget required for pre-epi clean, epi and emitter poly deposition is deemed affordable for the selected salicide. In this case, the epi steps 515C-515E may be moved after the salicidation step 515 and the deposition of the transistor protective oxide (TPROT) and its removal later on in the process is not needed. This variation of the process does not allow the salicidation of the emitter poly together with the other electrodes, however, and therefore a second dedicated salicidation step 515H may be run after the emitter formation, if required. In this case, the use of poly SiGe instead of Si for the emitter may help lower the salicide formation temperature, thus reducing interactions with the existing gate and S/D salicide.

In an embodiment of the invention, a method and system are disclosed for optoelectronic receivers 200/300 utilizing waveguide heterojunction phototransistors 111A-111D, 201A, 201B, 301, 400 integrated in a CMOS SOI wafer 410. Aspects of the invention may comprise receiving one or more optical signals via optical fibers 145 coupled to a top surface of the photonically-enabled CMOS chip 130. One or more electrical signals may be generated utilizing one or more germanium waveguide heterojunction phototransistors 111A-111D, 201A, 201B, 301, 400 that may detect the one or more optical signals from one or more grating couplers 117A-117D, 139. The electrical signals may be amplified via one or more voltage amplifiers 307, or one or more transimpedance amplifiers 203, the outputs of which may be utilized to bias the one or more germanium waveguide heterojunction phototransistors 111A-111D, 201A, 201B, 301, 400 by a feedback network 205A, 205B.

The one or more received optical signals may be coupled into opposite ends of the one or more waveguide heterojunction phototransistors 111A-111D, 201A, 201B, 301, 400. A collector region 419 of the one or more germanium waveguide heterojunction phototransistors 111A-111D, 201A, 201B, 301, 400 may comprise a silicon layer 421 and a germanium layer 419B, and a base region 417 of the one or more germanium waveguide heterojunction phototransistors 111A-111D, 201A, 201B, 301, 400 may comprise a silicon germanium alloy with germanium composition ranging from 70% to 100%. The germanium waveguide heterojunction phototransistors 111A-111D, 201A, 201B, 301, 400 may be biased via an electrical signal 309 applied to a base terminal 411 or via an optical signal. The received one or more optical signals may be demodulated by communicating a mixer signal 309 to a base terminal 411 of the one or more germanium waveguide heterojunction phototransistors 111A-111D, 201A, 201B, 301, 400.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:
   in a complementary metal-oxide semiconductor (CMOS) chip:
   receiving one or more optical signals via a top surface of said CMOS chip;
   generating one or more electrical signals in said CMOS chip utilizing one or more germanium waveguide heterojunction phototransistors by demodulating said received one or more optical signals utilizing a mixer signal applied to a base terminal of said one or more germanium waveguide heterojunction phototransistors.

2. The method according to claim 1, comprising amplifying said one or more generated electrical signals via one or more transimpedance amplifiers.

3. The method according to claim 2, comprising biasing said one or more germanium waveguide heterojunction phototransistors by a feedback network for said one or more transimpedance amplifiers.

4. The method according to claim 1, comprising amplifying said one or more generated electrical signals via one or more voltage amplifiers.

5. The method according to claim 1, comprising coupling said one or more received optical signals into opposite ends of said one or more germanium waveguide heterojunction phototransistors.

6. The method according to claim 1, wherein a collector region of said one or more germanium waveguide heterojunction phototransistors comprises a silicon layer and a germanium layer.

7. The method according to claim 1, wherein a base region of said one or more germanium waveguide heterojunction phototransistors comprises a silicon germanium alloy with germanium composition ranging from 70% to 100%.

8. The method according to claim 1, wherein an emitter of said one or more germanium waveguide heterojunction phototransistors comprises one or more of: crystalline silicon, crystalline silicon-germanium, poly-silicon, and/or poly-silicon-germanium.

9. The method according to claim 1, comprising biasing said one or more germanium waveguide heterojunction phototransistors via an optical signal.

10. The method according to claim 1, comprising detecting said one or more optical signals from said top surface of said CMOS chip via one or more grating couplers.

11. A system for processing signals, the system comprising:
a complementary metal-oxide semiconductor (CMOS) chip being operable to:
receive one or more optical signals via a top surface of said CMOS chip;
generate one or more electrical signals in said chip utilizing one or more germanium waveguide heterojunction phototransistors by demodulating said received one or more optical signals utilizing a mixer signal applied to a base terminal of said one or more germanium waveguide heterojunction phototransistors.

12. The system according to claim 11, wherein said CMOS chip is operable to amplify said one or more generated electrical signals via one or more transimpedance amplifiers.

13. The system according to claim 12, wherein said CMOS chip is operable to bias said one or more germanium waveguide heterojunction phototransistors by a feedback network for said one or more transimpedance amplifiers.

14. The system according to claim 11, wherein said CMOS chip is operable to amplifying said one or more generated electrical signals via one or more voltage amplifiers.

15. The system according to claim 11, wherein said CMOS chip is operable to couple said one or more received optical signals into opposite ends of said one or more germanium waveguide heterojunction phototransistors.

16. The system according to claim 11, wherein a collector region of said one or more germanium waveguide heterojunction phototransistors comprises a silicon layer and a germanium layer.

17. The system according to claim 11, wherein a base region of said one or more germanium waveguide heterojunction phototransistors comprises a silicon germanium alloy with germanium composition ranging from 70% to 100%.

18. The system according to claim 11, wherein an emitter of said one or more germanium waveguide heterojunction phototransistors comprises one or more of: crystalline silicon, crystalline silicon-germanium, poly-silicon, and/or poly-silicon-germanium.

19. The system according to claim 11, wherein said CMOS chip is operable to bias said one or more germanium waveguide heterojunction phototransistors via an optical signal.

20. The system according to claim 11, wherein said CMOS chip is operable to detect said one or more optical signals from said top surface of said photonically-enabled CMOS chip via one or more grating couplers.

* * * * *